United States Patent
Jang

(10) Patent No.: US 7,237,073 B2
(45) Date of Patent: Jun. 26, 2007

(54) MEMORY SYSTEM HAVING DATA INVERSION AND DATA INVERSION METHOD FOR A MEMORY SYSTEM

(75) Inventor: Seong-Jin Jang, Seongnam (KR)

(73) Assignee: Samsung Electronics Co., Ltd., Suwon-si, Gyeonggie-do (KR)

( * ) Notice: Subject to any disclaimer, the term of this patent is extended or adjusted under 35 U.S.C. 154(b) by 151 days.

(21) Appl. No.: 10/737,861

(22) Filed: Dec. 18, 2003

(65) Prior Publication Data

US 2005/0005054 A1 Jan. 6, 2005

(30) Foreign Application Priority Data

Jul. 3, 2003 (KR) ............ 10-2003-0044846

(51) Int. Cl.
*G06F 5/00* (2006.01)
*G06F 13/00* (2006.01)
*G11C 7/10* (2006.01)

(52) U.S. Cl. ............... 711/154; 365/202; 365/189.01; 710/100

(58) Field of Classification Search ............... 710/100, 710/305; 365/189, 200; 711/1, 105, 149; 345/98–99

See application file for complete search history.

(56) References Cited

U.S. PATENT DOCUMENTS

| 6,826,095 B2* | 11/2004 | Macri et al. ......... 365/189.07 |
| 2001/0052057 A1* | 12/2001 | Lai et al. ................. 711/154 |
| 2004/0065904 A1* | 4/2004 | Yoshida et al. ............ 257/200 |
| 2005/0182894 A1* | 8/2005 | LaBerge ................... 711/105 |

OTHER PUBLICATIONS

"ELPIDA 128M bits Self Terminated Interface DDR SDRAM" data sheets, Nov. 2002, pp. 1-46.

* cited by examiner

*Primary Examiner*—Donald Sparks
(74) *Attorney, Agent, or Firm*—Volentine & Whitt, P.L.L.C.

(57) ABSTRACT

A memory system and a method of reading and writing data to a memory device provide byte-by-byte write data insertion without adding extra pins or balls to the packaged device. Accordingly, the high frequency performance of the device can be improved.

22 Claims, 14 Drawing Sheets

MEMORY SYSTEM HAVING DATA INVERSION AND DATA INVERSION METHOD FOR A MEMORY SYSTEM

CROSS-REFERENCES TO RELATED APPLICATIONS

This application claims priority under 35 U.S.C § 119 from Korean Patent Application No. 2003-44846, filed on 3 Jul. 2003 the entirety of which is hereby incorporated by reference for all purposes as if fully set forth herein.

BACKGROUND AND SUMMARY

1. Field

This invention pertains to the field of memory systems, and more particularly, to a memory system having data inversion, and to a method of data inversion for a memory system.

2. Description

Generally, it is a goal to improve the data transfer speed of a memory system. To this end, various techniques are employed to improve the high frequency characteristics (speed) of a memory device. For some memory devices, a data inversion scheme is employed to reduce the simultaneous switching noise in the device and thereby improve the high frequency operating characteristics. An example of such a memory device and associated memory system will now be described in further detail.

FIG. 1 is a block diagram of a conventional memory system 1, having a memory device 100 and a memory controller 200.

The memory system 1 operates with a data inversion scheme, as follows. During a data write operation, the signals DM<0:3> perform a data masking operation, WDQS<0:3> operate as data strobe signals, and DIM is a write data inversion flag in indicating whether or not the data (all four data bytes) should be inverted. Meanwhile, during a data read operation, the signals RDQS<0:3> operate as data strobe signals, and DM<0:3> are read data inversion flags.

FIG. 2 shows an exemplary ball (or pin) configuration of a conventional mode memory device 100 with data inversion. As can be seen from FIG. 2, the memory device 100 includes a dedicated pin or ball 160 for the write data inversion flag DIM.

FIG. 3 shows a data processing block diagram of the memory device 100. The memory device 100 includes data processing circuit 110 for byte0, data processing circuit 120 for byte1, data processing circuit 130 for byte2, data processing circuit 140 for byte4, and memory cell array 150. In the memory device 100, each single bit of the RDQS<0:3> data strobe signals at pins 111, 121, 131 and 141, and the WDQS<0:3> data strobe signals at pins 112, 122, 132 and 142, is dedicated to one data processing unit 110, 120, 130 or 140 for processing one eight-bit byte of data for the memory cell array 150. During a data write operation, DM<0:3> at pins 114, 124, 134, and 144, masks write data for the four data processing circuits 110, 120, 130 and 140. Meanwhile, during a data read operation, each single bit of the DM<0:3> signals is dedicated as a read data inversion flag for one of the data processing unit 110, 120, 130 or 140. On the other hand, during a data write operation, DIM at pin 160 is used as a write data inversion flag for all four data bytes. Four bytes of data comprising DQ<0:31> are input/output at the input/outputs 113, 123, 133 and 143.

FIG. 4 shows a block diagram of the byte0 data processing circuit 110 of the memory device 100. The data processing circuits 120, 130, and 140 in FIG. 3 are configured similarly to data processing circuit 110. The data processing circuit 110 comprises a number of components, including data strobe signal generator 113, data control circuit 114, and the data inversion block 115. The data strobe signal generator 113 generates the read data strobe signal RDQS0. Data control circuit 114 controls data input/output during both data read and data write operations. DM0 performs two functions: it masks write data during a data write operation, and it serves to output the read data inversion flag R_FLAG0 during a data read operation. Meanwhile, DIM outputs the write data inversion flag W_FLAG during a data write operation. The data inversion block 115 performs a data inversion process during read and write operations according to the flags R_FLAG0 and W_FLAG.

FIG. 5 shows a conventional data inversion block 115. The data inversion block 115 includes the data toggle detection circuit 115-1 and the data inversion circuit 115-2. The data toggle detection circuit 115-1 detects whether the read data input from a memory cell array are inverted or not, and then outputs the read data inversion flag R_FLAG0 having the corresponding logic state. Data inversion circuit 115-2 inverts the data being written to, or read from, the memory cell array according to the logical states of the W_FLAG in a data write mode, or the R_FLAG0 in a data read mode.

The data inversion block 115 reduces the simultaneous switching noise in the input/output buffers of the memory device 100 and thereby improves the high frequency characteristics of the device.

FIG. 6 shows a conventional data toggle detection circuit 115-1. The data toggle detection circuit 115-1 compares input data DATA_INT<0:7> with a reference terminal having a reference current capability of 3.5 units. If, for example, DATA_INT<0:7> is 11111110, then the node N1 will be pulled down to a logical low state (0), and the output signal R_FLAG0 will be in a logical high state (1). Meanwhile, if DATA_INT<0:7> is 11100000, then the node N1 will be pulled up to a logical high state (1), and the output signal R_FLAG0 will be in a logical low state (0). Accordingly, if the number of bits of DATA_INT<0:7> which are logically high are greater than 4 then R_FLAG0 will be logically high, while if the number of bits of DATA_INT<0:7> which are logically high are less than 4, then R_FLAG0 will be logically low.

FIG. 7 shows a conventional data inversion circuit 115-2. The data inversion circuit 115-2 includes data inverters 116-1, 116-2, 116-3, 116-4, 116-5, 116-6, 116-7, and 116-8. The data inverters 116-2, 116-3, 116-4, 116-5, 116-6, 116-7, and 116-8 in FIG. 7 are configured similarly to data inverter 116-1. During a data read operation, the READ signal closes the switches S5 and S7, while the R_FLAG0 signal closes one of the switches S1 and S2 depending upon whether the corresponding data bit is to be inverted or not. Similarly, during a data write operation, the WRITE signal closes the switches S6 and S8, while the W_FLAG signal closes one of the switches S3 and S4 depending upon whether the corresponding data bit is to be inverted or not.

FIG. 8 shows a timing diagram of a memory device with a data inversion scheme. In particular, the timing diagram of FIG. 8 shows a memory device with so-called "Burst-4" operation wherein four data bytes are written to, or read from, the memory device in a sequential burst. As can be seen from FIG. 8, read data (Q0, Q1, Q2, and Q3) are output from the memory device in sync with the rising edge of RDQS0. Meanwhile, write data (D0, D1, D2, and D3) are input to the memory device in sync with the center of the WDQS0 pulses (center strobing). Furthermore, DM0 operates as a read data inversion flag during data read operations, and to mask write data during data write operations. DIM operates as a write data inversion flag during data write operations.

Accordingly, operation of a conventional memory system 1 with a single DQS memory device 100 and a memory controller 200 has now been explained in relevant part with respect to FIGS. 1–8.

However, there are drawbacks to memory system with data inversion as described above.

For one thing, an additional pin (DIM pin) is required for the write data inversion flag. This increases the pin overhead of the memory device.

For another thing, only one write data inversion flag is provided for all of the data inputs (e.g., 32 DQ input pins) of the memory device. So, with the device and method illustrated in FIGS. 1–8, it is not possible to selectively apply data inversion to individual bytes during a data write operation. Meanwhile, applying write data inversion on a byte-by-byte basis improves the high frequency operation of the device.

Accordingly, it would be advantageous to provide a memory system and memory device having an improved data inversion function. It would also be advantageous to provide an improved method of data inversion for a memory device. Other and further objects and advantages will appear hereinafter.

The present invention is directed toward a memory system and memory device having an improved data inversion function, and an improved method of data inversion for a memory device.

In one aspect of the invention, a memory device comprises: a memory cell array that stores data; a data input/output (I/O) bus through which the data is written into and read from the memory device; a data inversion circuit that selectively inverts the data when it is written into and read from the memory cell array; and a first input/output (I/O) that carries a read data strobe when reading the data from the memory device, and that carries a write data inversion flag when writing the data into the memory device.

In another aspect of the invention, a controller adapted to write data into a memory device and to read the data out of the memory device in response to data strobe signals comprises: a data input/output (I/O) bus through which the controller writes data to, and reads data from, a memory device; and a first input/output (I/O) that carries a read data strobe when reading the data from the memory device, and that carries a write data inversion flag when writing the data into the memory device.

In yet another aspect of the invention, a memory system comprises: a memory device having a memory cell array that stores data; a controller, connected to the memory device, that writes the data into the memory device and to reads the data out of the memory device in response to data strobe signals; and a first input/output (I/O) line, between the controller and memory device, that carries a read data strobe when reading the data from the memory device, and that carries a write data inversion flag when writing the data into the memory device.

DETAILED DESCRIPTION

Figure 9:
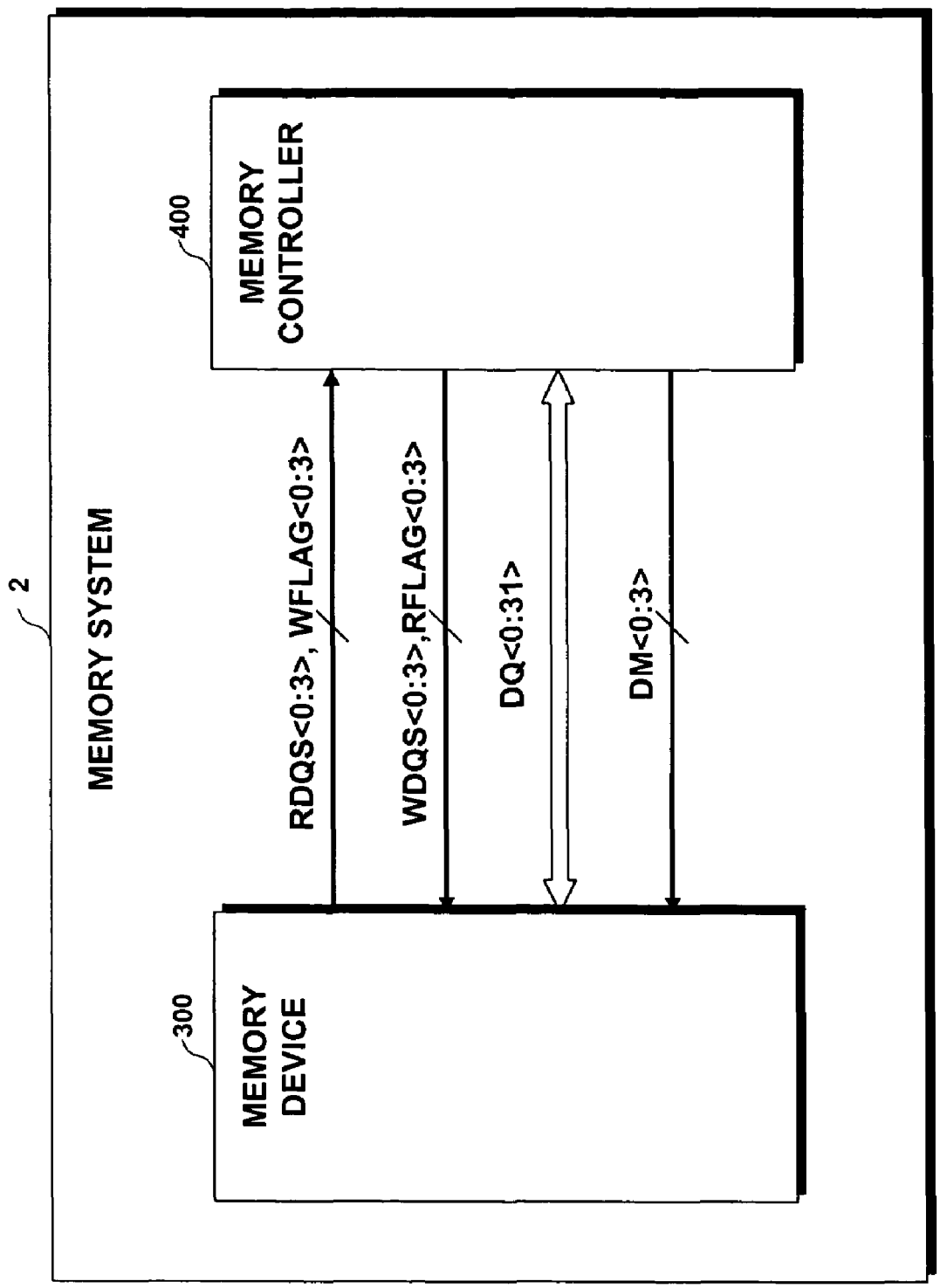
FIG. 9 shows a block diagram of one embodiment of memory system according to one or more aspects of the present invention.

FIG. 9 shows one embodiment of a memory system 2 operating with data inversion. The memory system 2 includes a memory device 300 and a memory controller 400. In clear distinction from the memory system 1 of FIG. 1, the memory system 2 does not include any DIM signal between the memory controller 400 and the memory device 300.

Figure 2:
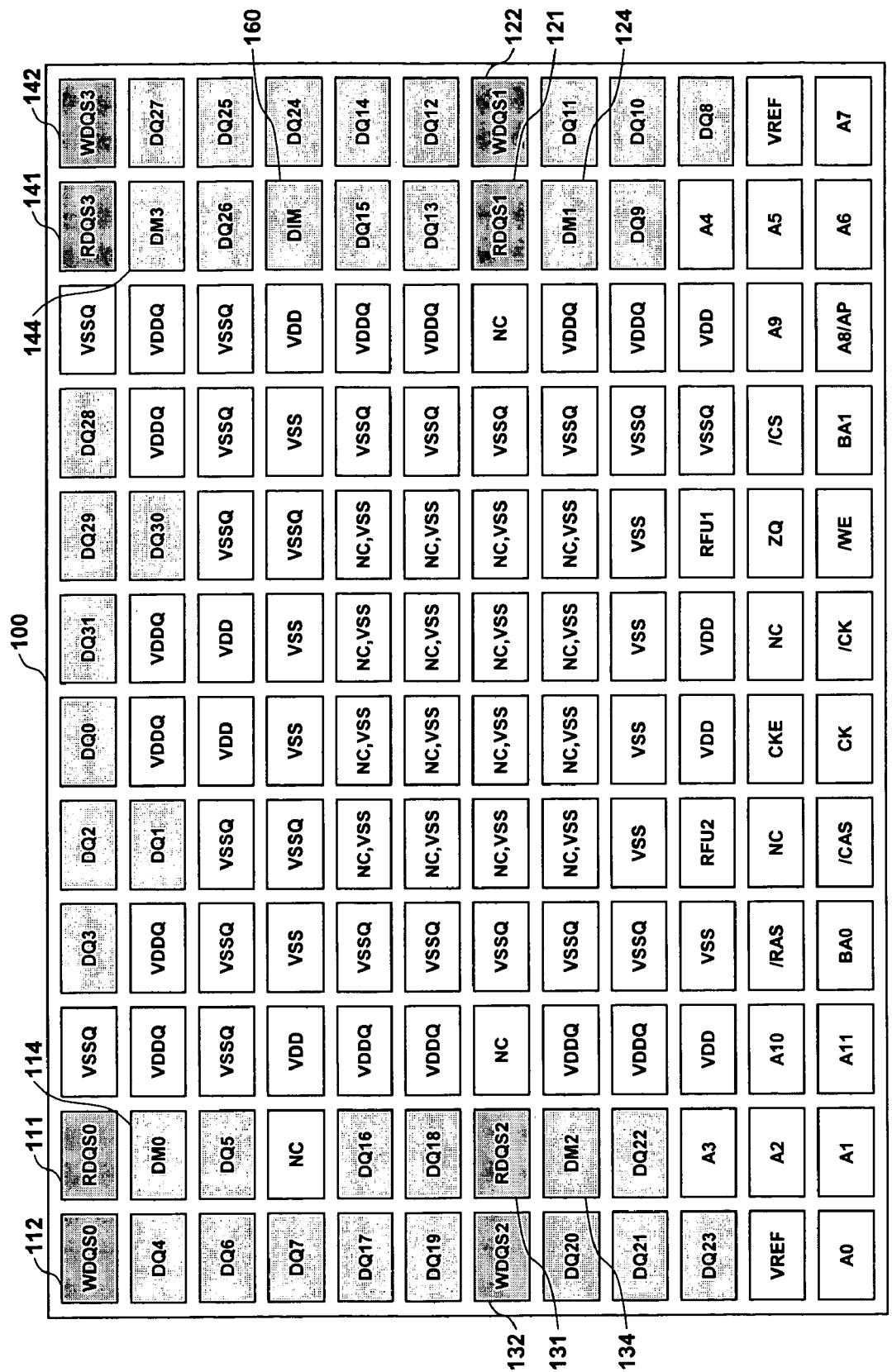
FIG. 2 shows a ball (or pin) configuration of a conventional memory device with data inversion.
Figure 10:
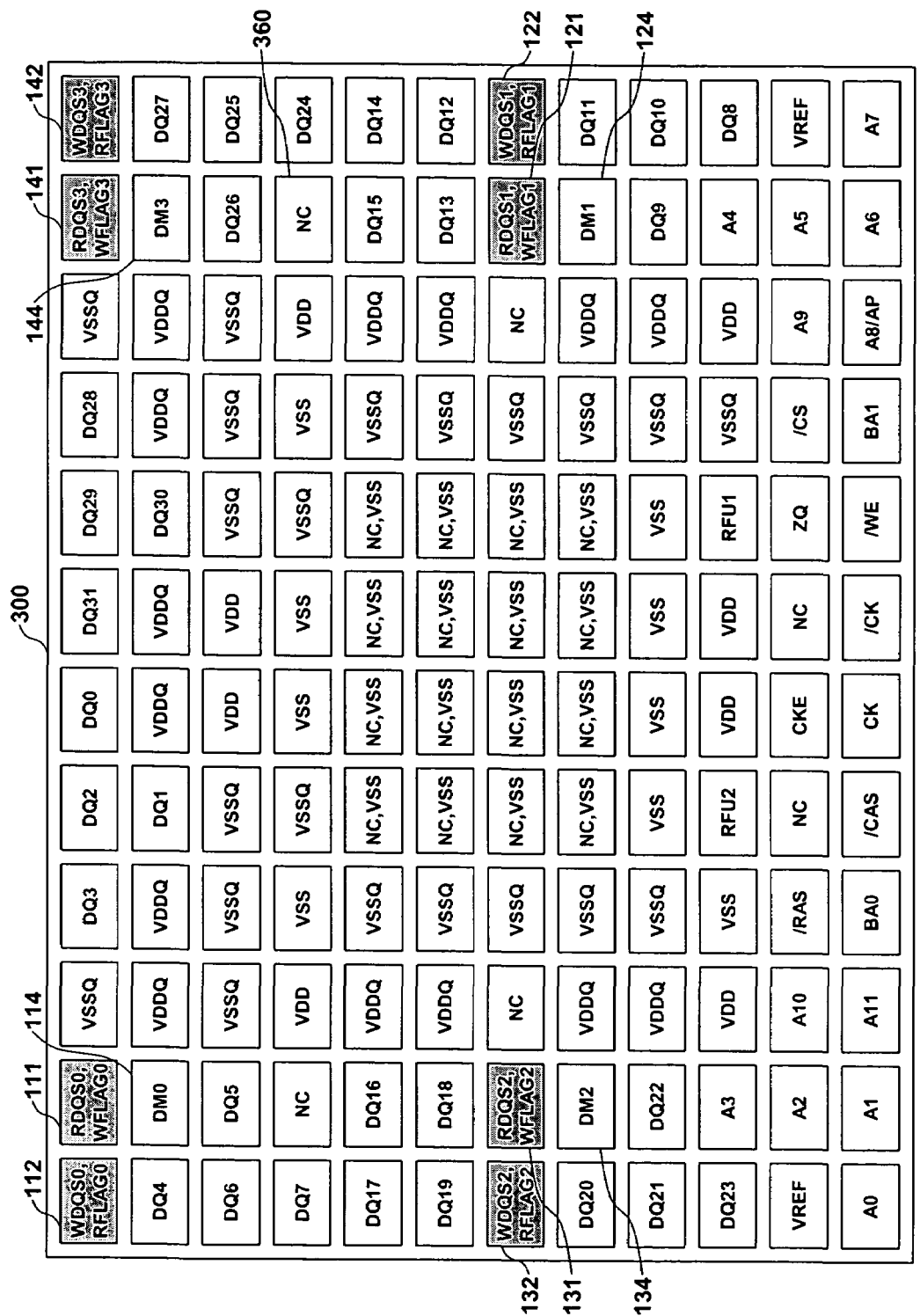
FIG. 10 shows a ball (or pin) configuration of one embodiment of a memory device system according to one or more aspects of the present invention.

FIG. 10 shows an exemplary ball (or pin) configuration of the memory device 300. As can be seen from FIG. 10, the balls (or pins) of the memory device 300 similar to those for the memory device 100 shown in FIG. 2, except that the memory device 300 does not include the DIM pin 160, and instead has an extra unused (NC) pin 360. Also, the balls/pins 311, 321, 331 and 341 in FIG. 10 are named RDQS<0:3>,WFLAG<0:3>, and the balls/pins 312, 322, 332 and 342 in FIG. 10 are named WDQS<0:3>,RFLAG<0:3>, as will be explained in greater detail below.

Figure 11:
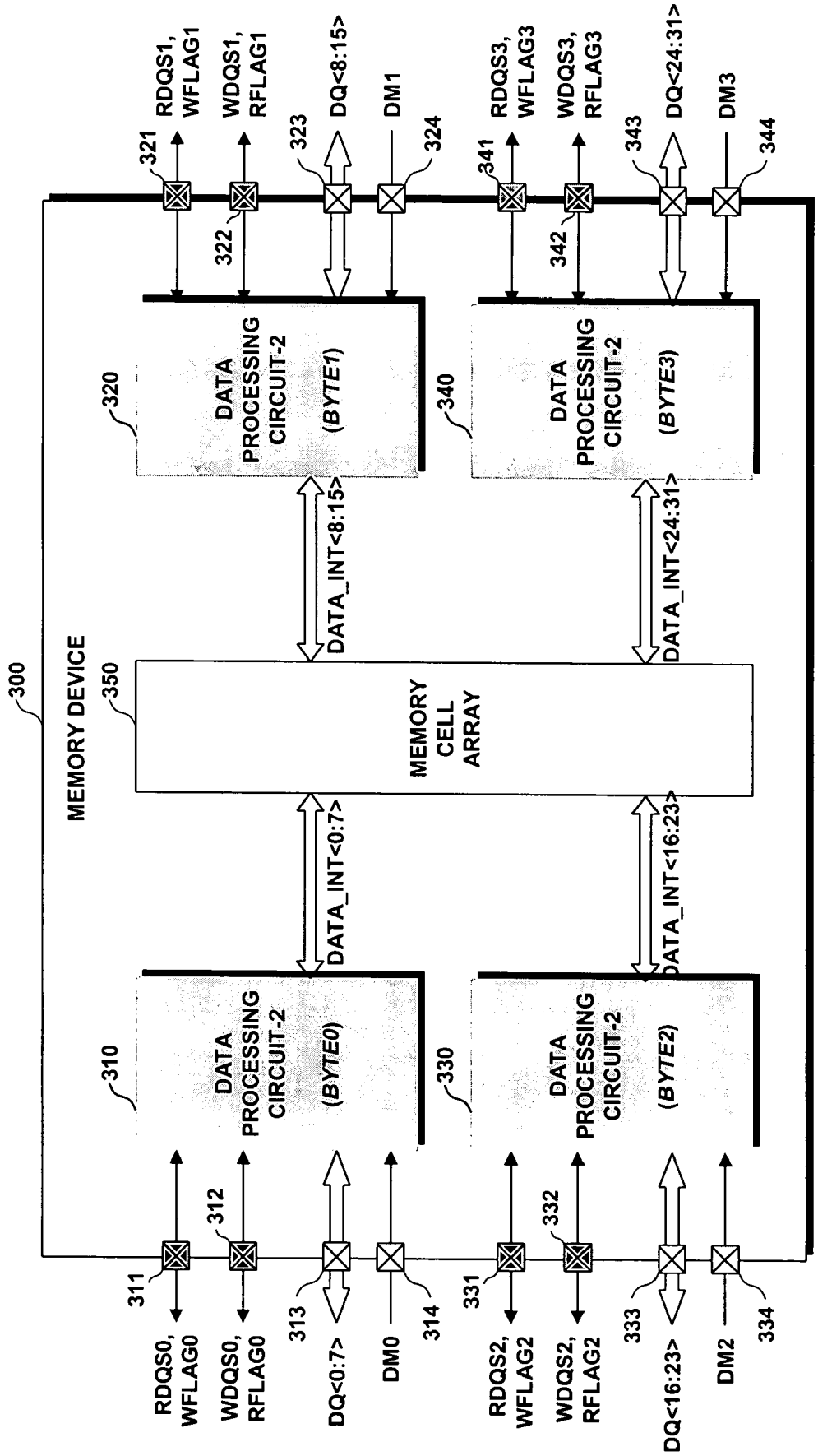
FIG. 11 shows a data processing block diagram of one embodiment of a memory device system according to one or more aspects of the present invention.

FIG. 11 shows a data processing block diagram of one embodiment of the memory device 300. The memory device 300 includes data processing circuit 310 for byte0, data processing circuit 320 for byte1, data processing circuit 330 for byte2, data processing circuit 340 for byte4, and memory cell array 350. In the memory device 300, each single bit of data on the RDQS<0:3>,WFLAG<0:3> signals at pins 311, 321, 331 and 341, and the WDQS<0:3>,RFLAG<0:3> signals at pins 312, 322, 332 and 342, is dedicated to one data processing unit 310, 320, 330 or 140 for processing one eight-bit byte of data for the memory cell array 350.

During a data read operation, four bytes of data comprising DQ<0:31> are output from the data processing units 310, 320, 330 or 340 via the input/outputs 313, 323, 333 and 343, with the RDQS<0:3>,WFLAG<0:3> signals functioning as read data strobes. Meanwhile, the WDQS<0:3>,RFLAG<0: 3> signals function as read data inversion flags for each of the four data bytes.

On the other hand, during a data write operation four bytes of data comprising DQ<0:31> are input to the data processing units 310, 320, 330 or 340 via the input/outputs 313, 323, 333 and 343, with the WDQS<0:3>,RFLAG<0:3> signals functioning as write data strobes. Meanwhile the RDQS<0:3>,WFLAG<0:3> signals function as write data inversion flags for each of the four data bytes. Also during a data write operation, DM<0:3> at pins 314, 324, 334, and 344, masks write data for the four data processing circuits 310, 320, 330 and 340.

Figure 3:
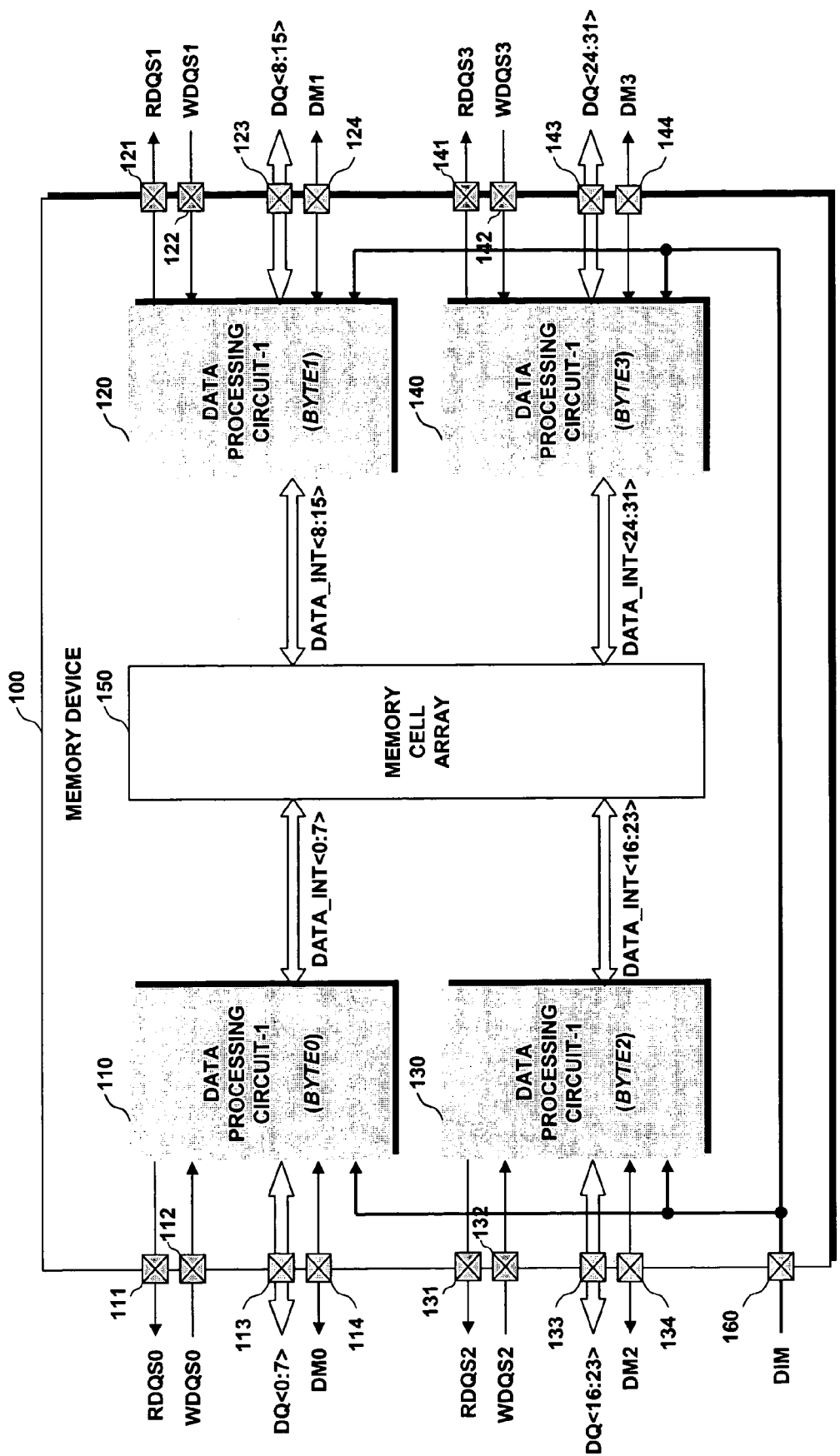
FIG. 3 shows a data processing block diagram of a conventional memory device.
Figure 4:
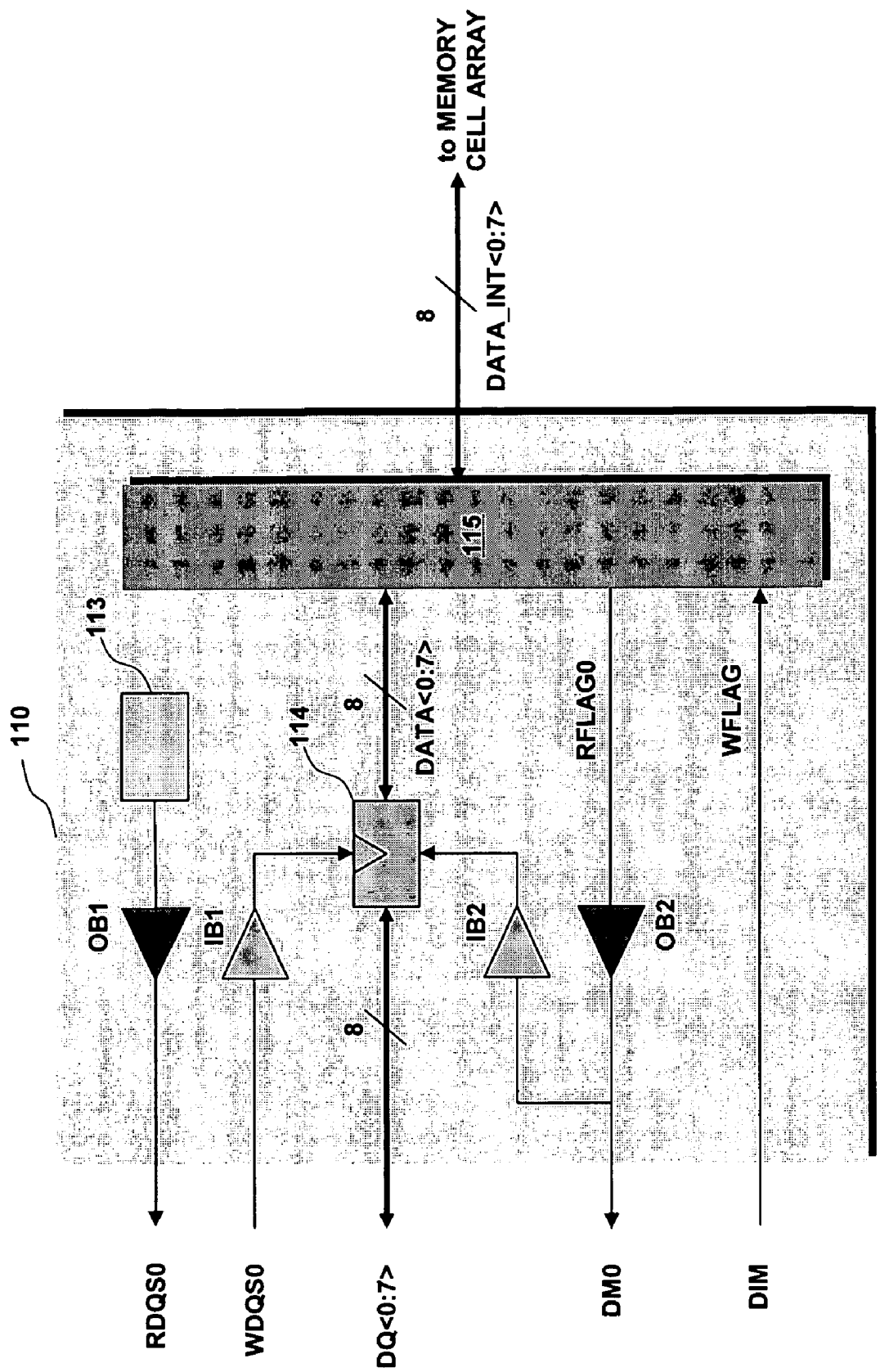
FIG. 4 shows a block diagram of a conventional byte0 data processing circuit.
Figure 12:
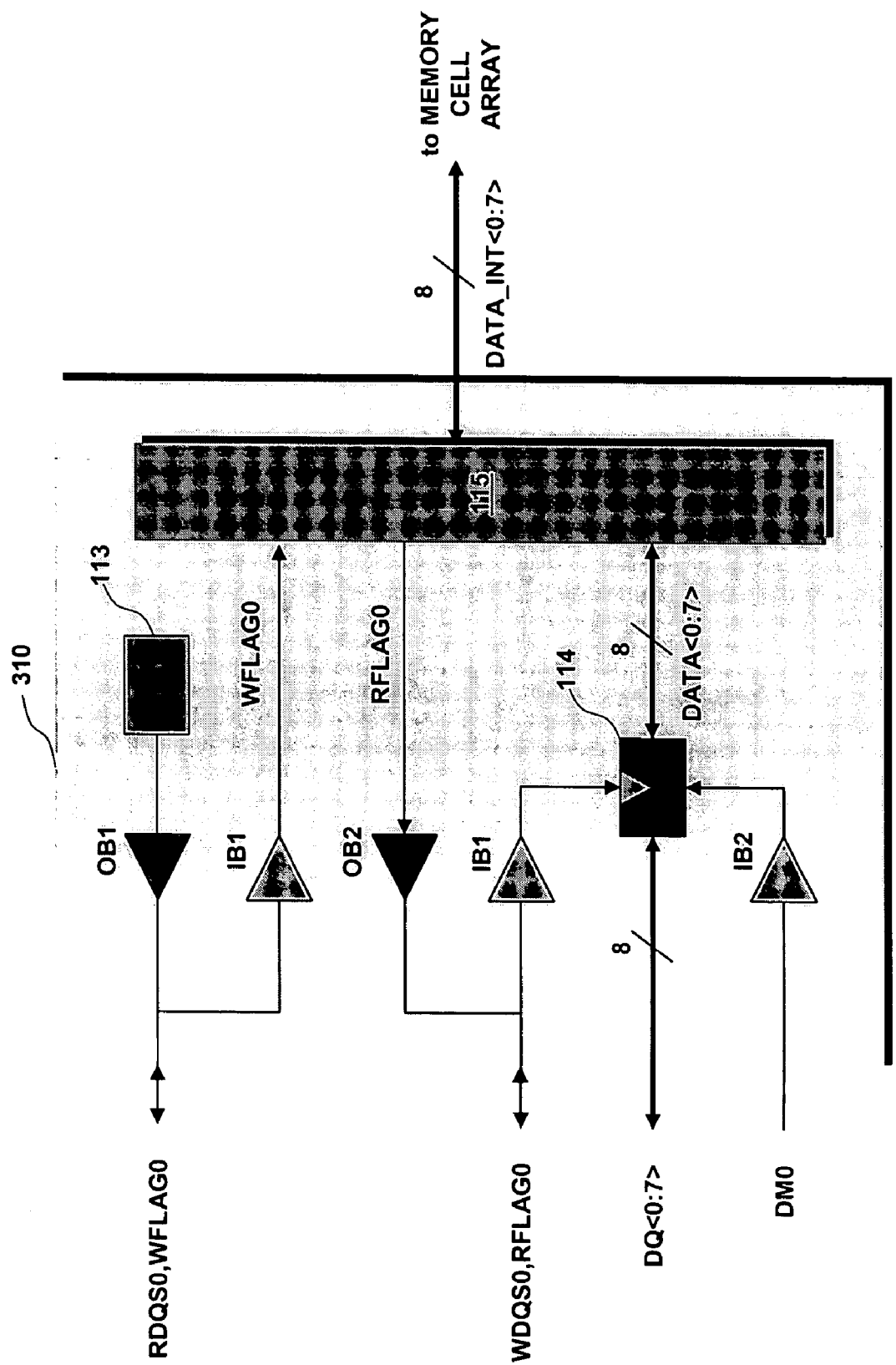
FIG. 12 shows a block diagram of one embodiment of a byte0 data processing circuit according to one or more aspects of the present invention.

FIG. 12 shows a block diagram of one embodiment of the byte0 data processing circuit 310 of the memory device 300. The data processing circuits 320, 330, and 340 in FIG. 3 are configured similarly to data processing circuit 310. The data processing circuit 310 comprises a number of components, including data strobe signal generator 113, data control circuit 114, and the data inversion block 115. Data control circuit 114 controls data input/output during both data read and data write operations in response to the WDQS0, RFLAG0 signal, as will be explained below.

During a data read operation, the data control circuit 114 outputs the read data DATA<0:7> as the DQ<0:7> signals. The data strobe signal generator 113 generates the read data strobe signal and outputs the read data strobe through the output buffer OB1 as the RDQS0,WFLAG0 signal. Meanwhile, the read data inversion flag is output from the data inversion block 115 through the output buffer OB2 to the WDQS0,RFLAG0 signal.

During a data write operation, the data control circuit 114 inputs the read data DATA<0:7> from the DQ<0:7> signals in response to the write data strobe signal WDQS0,RFLAG0 and the data mask signal DM0. As shown in FIG. 12, during the data write operation, the write data strobe signal WDQS0,RFLAG0 is provided to a clock input of the data control circuit 114 to clock in the read data DQ<0:7>. The data mask DM0 is supplied to an enable input of the data control circuit 114, disabling operation when the write data is masked. The data inversion block 115 performs a data inversion process during write operations according to the write data inversion flag input to the input buffer IB1 from the RDQS0,WFLAG0 signal.

Figure 5:
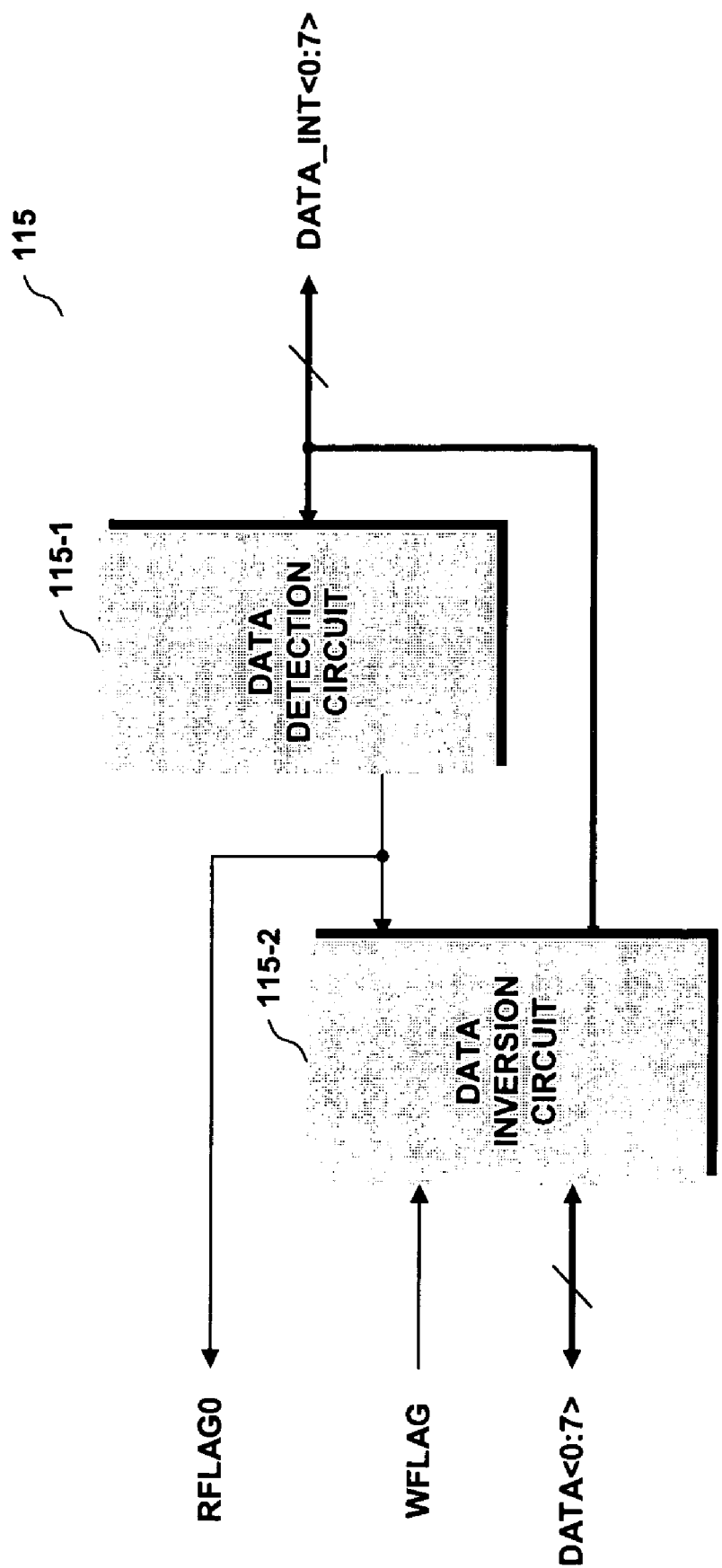
FIG. 5 shows a conventional data inversion circuit.
Figure 6:
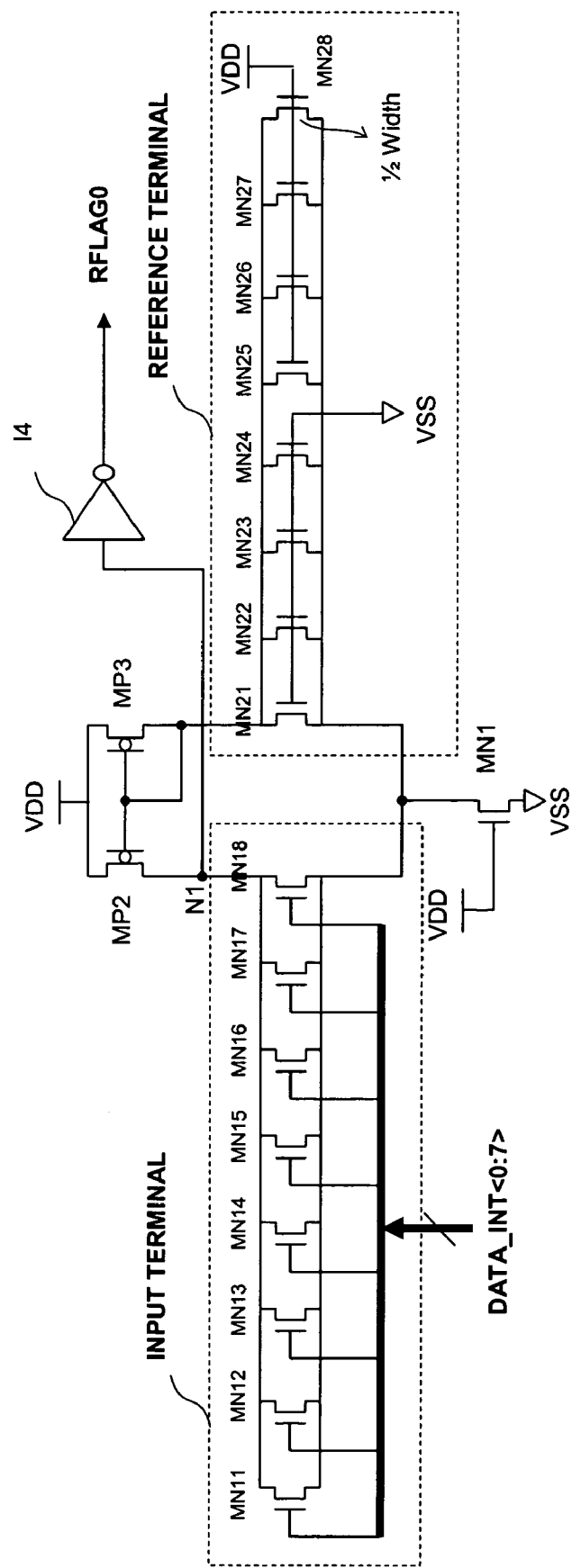
FIG. 6 shows a conventional data toggle detection circuit.
Figure 7:
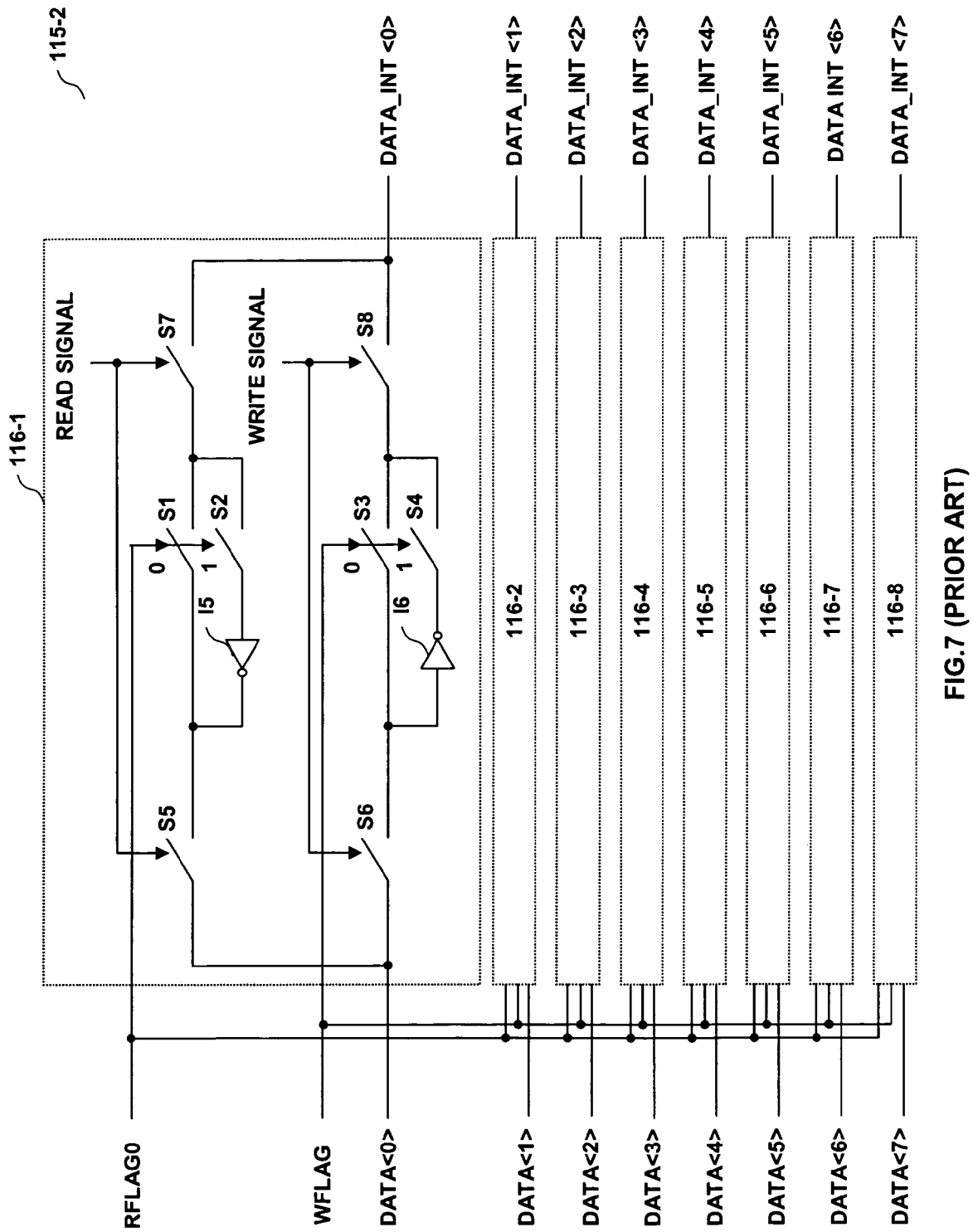
FIG. 7 shows a conventional data inversion block.
Figure 8:
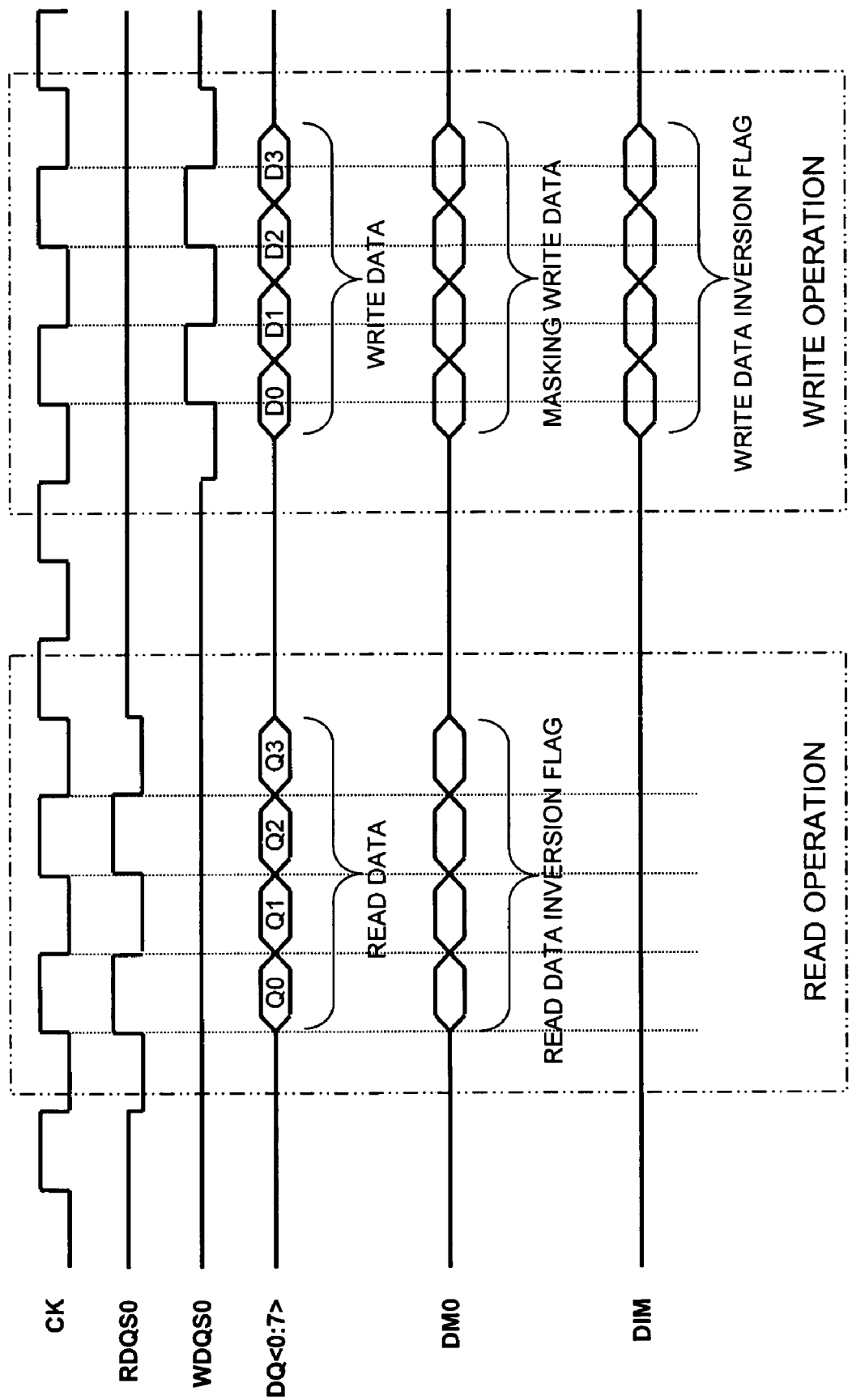
FIG. 8 shows a timing diagram of a memory device with a data inversion circuit.

The operation of the data inversion block 115 itself is the same as for the memory device 100, which was described in detail previously with respect to FIGS. 5–7. So for brevity, that explanation is not repeated again here.

Figure 13:
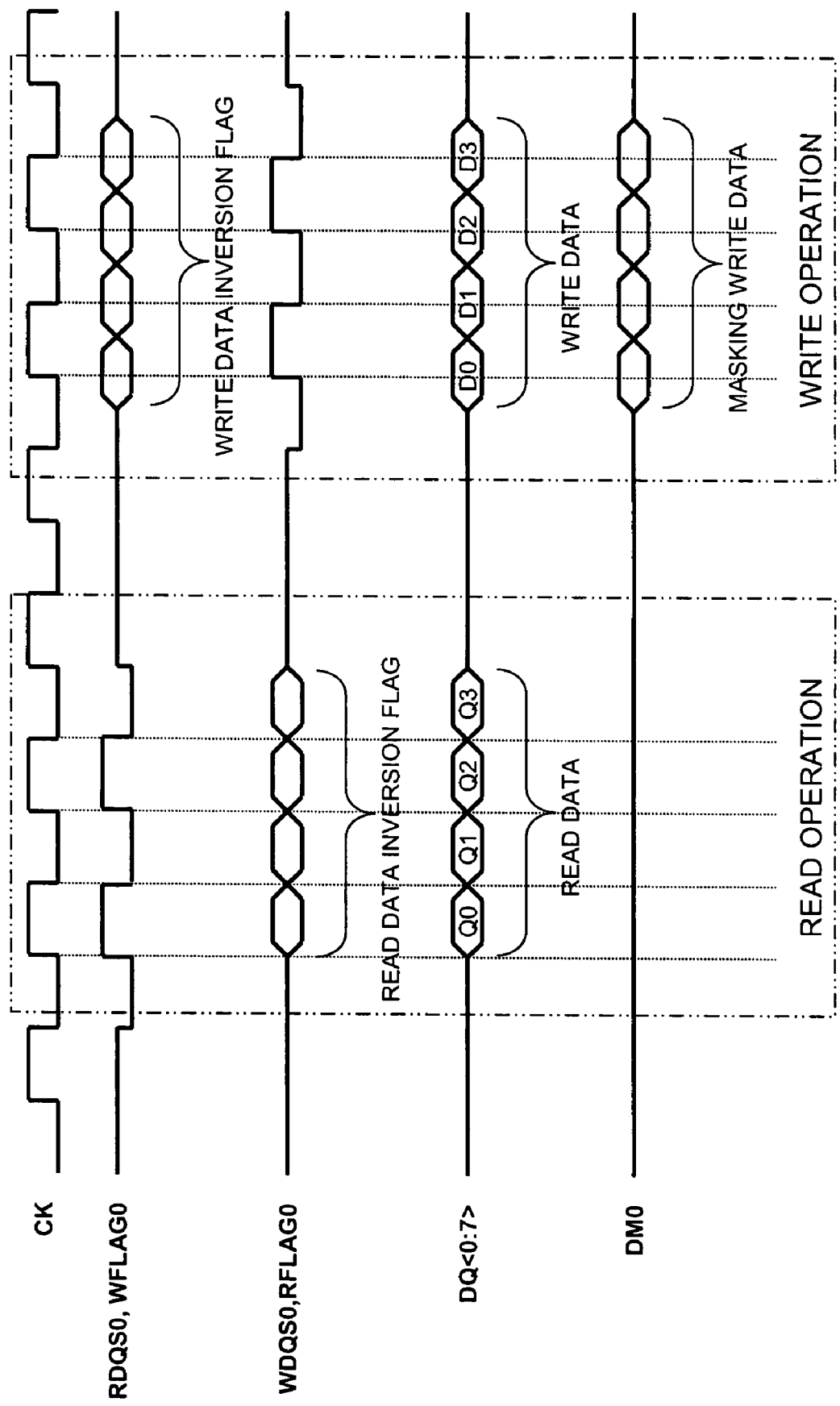
FIG. 13 shows a timing diagram of one embodiment of a memory device with a data inversion circuit according to one or more aspects of the present invention.

FIG. 13 shows a timing diagram of one embodiment of a memory device with a data inversion scheme. In particular, the timing diagram of FIG. 13 shows a memory device with so-called "Burst-4" operation wherein four data bytes are written to, or read from, the memory device in a sequential burst. As can be seen from FIG. 13, read data (Q0, Q1, Q2, and Q3) are output from the memory device in sync with the rising edge of the RDQS0,WFLAG0 signal. The WDQS0, RFLAG0 signal operates as a read data inversion flag during data read operations. Meanwhile, write data (D0, D1, D2, and D3) are input to the memory device in sync with the center of the WDQS0,RFLAG0 pulses (center strobing). Furthermore, DM0 masks write data during data write operations. The RDQS0,WFLAG0 signal operates as a write data inversion flag during data write operations.

Figure 1:
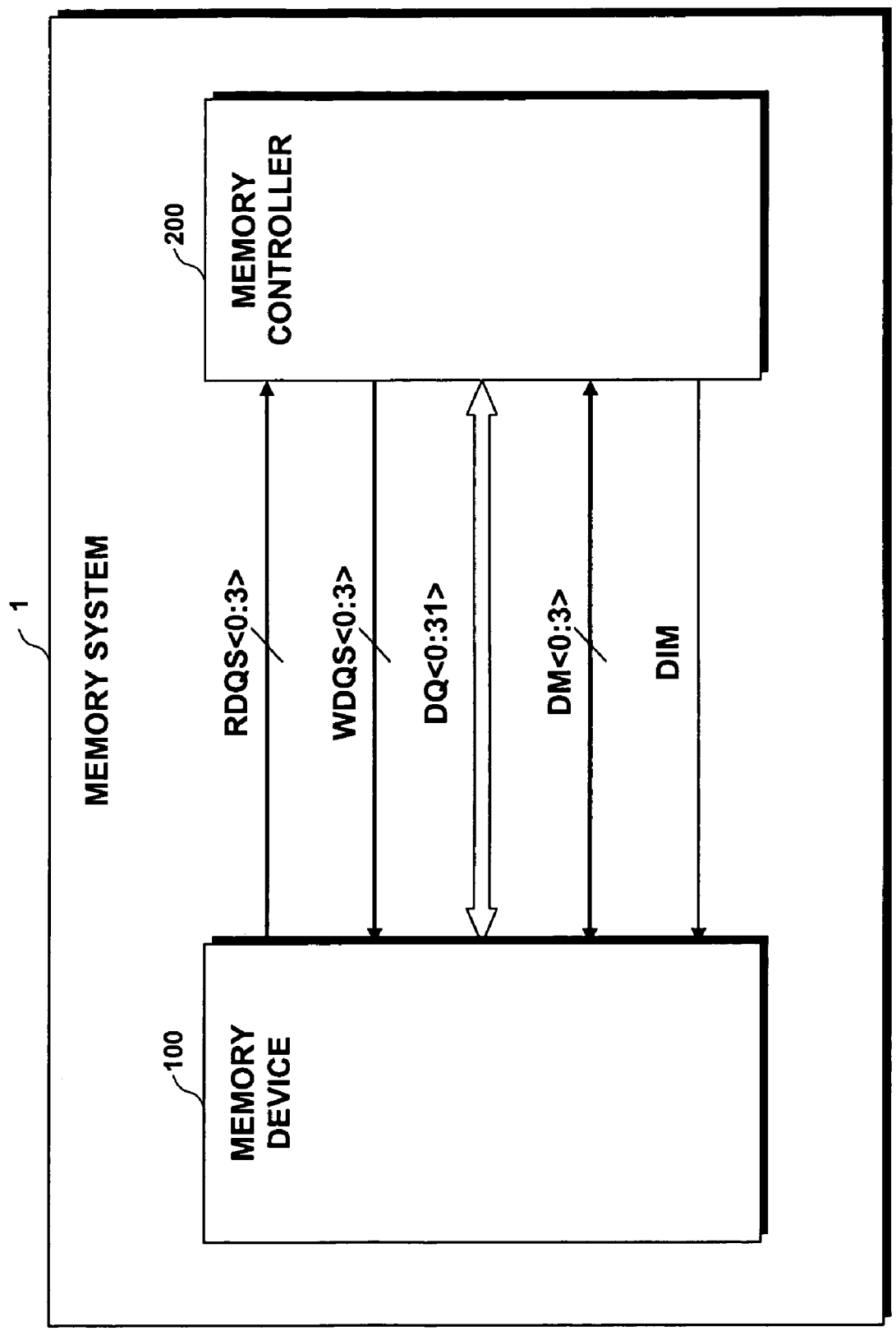
FIG. 1 is a block diagram of a memory system with a memory device having a data inversion scheme.

Table 1 below compares the function of various input/outputs for the memory device 300 of FIGS. 9 and 11, with those of the memory device 100 of FIGS. 1 and 3.

TABLE 1

| INPUT/OUTPUT PINS | READ OPERATION | | WRITE OPERATION | |
|---|---|---|---|---|
| | MEMORY DEVICE 100 | MEMORY DEVICE 300 | MEMORY DEVICE 100 | MEMORY DEVICE 300 |
| DM<0:3> | Read Data Inversion Flag | DNC | Write Data Masking | Write Data Masking |
| DIM | DNC | | Write Data Inversion Flag | |
| RDQS<0:3> (RDQS<0:3>, WFLAG<0:3>) | Read Data Strobe | Read Data Strobe | DNC | Write Data Inversion Flag |
| WDQS<0:3> (WDQS<0:3>, RFLAG<0:3>) | DNC | Read Data Inversion Flag | Write Data Strobe | Write Data Strobe |

Beneficially, because the memory device 300 operates with four write data inversion flags (RDQS<0:3>, WFLAG<0:3>), write data inversion can be individually performed on a data byte by byte basis. This is in contrast to the memory device 100 of FIG. 1, and improves the high frequency performance of the device.

While preferred embodiments are disclosed herein, many variations are possible which remain within the concept and scope of the invention.

Figure 14:
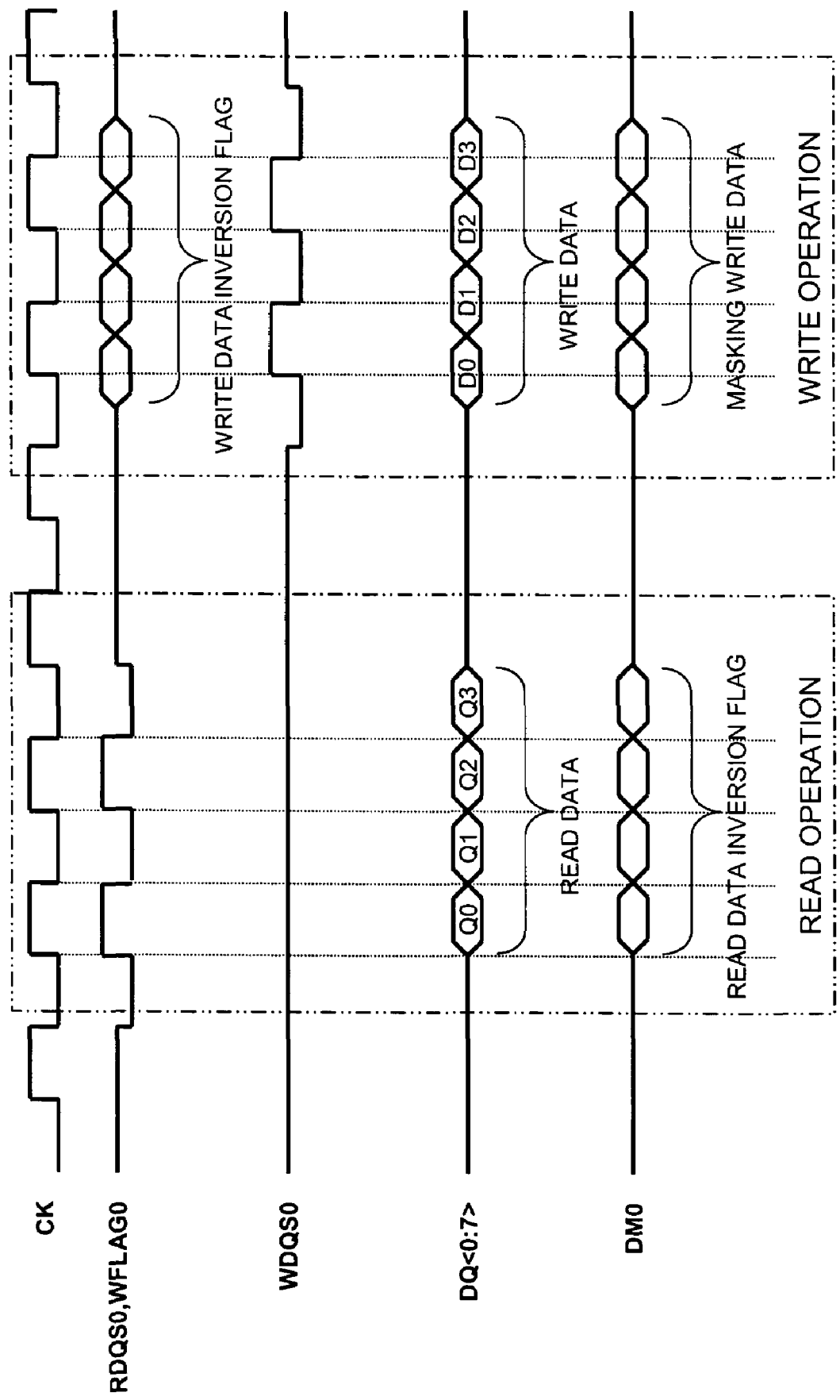
FIG. 14 shows a timing diagram of another embodiment of a memory device with a data inversion circuit according to one or more aspects of the present invention

For example, FIG. 14 shows a timing diagram of another embodiment of a memory device with a data inversion scheme. In similarity to FIG. 13, the timing diagram of FIG. 14 shows a memory device with so-called "Burst-4" operation wherein four data bytes are written to, or read from, the memory device in a sequential burst. As can be seen from FIG. 14, read data (Q0, Q1, Q2, and Q3) are output from the memory device in sync with the rising edge of the RDQS0, WFLAG0 signal. DM0 operates as a read data inversion flag during data read operations. Meanwhile, write data (D0, D1, D2, and D3) are input to the memory device in sync with the center of the WDQS0 pulses (center strobing). Furthermore, DM0 masks write data during data write operations. The RDQS0,WFLAG0 signal operates as a write data inversion flag during data write operations.

Table 2 below compares the function of various input/outputs for the memory device whose timing diagram is illustrated in FIG. 14, with those of the memory device 100 of FIGS. 1 and 3.

TABLE 2

| INPUT/OUTPUT PINS | READ OPERATION | | WRITE OPERATION | |
| --- | --- | --- | --- | --- |
| | MEMORY DEVICE 100 | MEMORY DEVICE 300 | MEMORY DEVICE 100 | MEMORY DEVICE 300 |
| DM<0:3> | Read Data Inversion Flag | Read Data Inversion Flag | Write Data Masking | Write Data Masking |
| DIM | DNC | | Write Data Inversion Flag | |
| RDQS<0:3> (RDQS<0:3>, WFLAG<0:3>) | Read Data Strobe | Read Data Strobe | DNC | Write Data Inversion Flag |
| WDQS<0:3> | DNC | DNC | Write Data Strobe | Write Data Strobe |

Beneficially, because the memory device described in Table 2 also operates with four write data inversion flags (RDQS<0:3>,WFLAG<0:3>), write data inversion can be individually performed on a data byte by byte basis. This is in contrast to the memory device 100 of FIG. 3, and improves the high frequency performance of the device.

These and other such variations would become clear to one of ordinary skill in the art after inspection of the specification, drawings and claims herein. The invention therefore is not to be restricted except within the spirit and scope of the appended claims.

I claim:

1. A memory device, comprising:
a memory cell array that stores data;
a data input/output (I/O) bus through which the data is written into and read from the memory device;
a data inversion circuit that selectively inverts the data when it is written into and read from the memory cell array; and
an individual first input/output (I/O) line that carries a read data strobe when reading the data from the memory device, and that carries a write data inversion flag when writing the data into the memory device.

2. The memory device of claim 1, further comprising an individual second I/O line that carries a write data strobe when writing the data into the memory device, and that carries a read data inversion flag when reading the data from the memory device.

3. The memory device of claim 1, further comprising an individual second I/O line that carries a write data masking signal when writing the data into the memory device, and that carries a read data inversion flag when reading the data from the memory device.

4. The memory device of claim 3, further comprising a unidirectional input that carries a write data strobe.

5. The memory device of claim 1, wherein the memory cell array stores the data in a plurality of data words, wherein each data word comprises a plurality of data bytes, and wherein the memory device further comprises means for selectively inverting individual bytes of the data when the data is written into the memory cell array.

6. The memory device of claim 1, wherein the write data inversion flag controls write data inversion for all bytes of data written into the memory device.

7. A controller adapted to write data into a memory device and to read the data out of the memory device in response to data strobe signals, the controller comprising:

a data input/output (I/O) bus through which the controller writes data to, and reads data from, a memory device; and
an individual first input/output (I/O) line that carries a read data strobe when reading the data from the memory device, and that carries a write data inversion flag when writing the data into the memory device.

8. The controller of claim 7, further comprising an individual second I/O line that carries a write data strobe when writing the data into the memory device, and that carries a read data inversion flag when reading the data from the memory device.

9. The controller of claim 7, further comprising an individual second I/O line that carries a write data masking signal when writing the data into the memory device, and that carries a read data inversion flag when reading the data from the memory device.

10. The controller of claim 7, wherein the write data inversion flag controls a write data inversion operation for all bytes of data written into the memory device.

11. The controller of claim 7, wherein the controller outputs a plurality of data words, wherein each data word comprises a plurality of data bytes, and wherein the controller also outputs a plurality of write data inversion flags, each write data inversion flag indicating whether a corresponding byte of a data word is to be inverted.

12. A memory system, comprising:
a memory device having a memory cell array that stores data;
a controller, connected to the memory device, that writes the data into the memory device and that reads the data out of the memory device in response to data strobe signals; and
an individual first input/output (I/O) line, between the controller and memory device, that carries a read data strobe when reading the data from the memory device, and that carries a write data inversion flag when writing the data into the memory device.

13. The memory system of claim 12, further comprising an individual second I/O line between the controller and memory device that carries a write data strobe when writing the data into the memory device, and that carries a read data inversion flag when reading the data from the memory device.

14. The memory system of claim 12, further comprising an individual second I/O line between the controller and memory device that carries a write data masking signal when writing the data into the memory device, and that carries a read data inversion flag when reading the data from the memory device.

15. The memory system of claim 12, wherein the write data inversion flag controls a write data inversion operation for all bytes of data written into the memory device.

16. The memory system of claim 12, wherein the memory cell array stores the data in a plurality of data words, wherein each data word comprises a plurality of data bytes, and wherein the memory device further comprises means for selectively inverting individual bytes of the data when the data is written into the memory cell array.

17. A method of writing data to a memory cell in a memory device, wherein the data comprises a plurality of data words and each data word comprises a plurality of data bytes, the method comprising:
receiving a data word at a data input of the memory device;
receiving a plurality of write data inversion flags at the memory device, each write data inversion flag indicating whether a corresponding byte of the received data word should be inverted;
selectively inverting individual bytes of the received data word according to the write data inversion flags; and
writing the selectively inverted data word into the memory cell,
wherein the plurality of write data inversion flags are received at the memory device at a plurality of pins each of which also carries a data strobe signal during a data read operation for the memory device.

18. The method of claim 17, further comprising receiving a plurality of write data strobes at the memory device, each write data strobe corresponding to one byte of the received data word, wherein writing the selectively inverted data word into the memory cell includes writing each data byte into the memory cell in synchronism with the corresponding write data strobe, and wherein the write data strobes are received at the memory device at a plurality of pins each of which also carries a read data inversion flag during a data read operation for the memory device.

19. A method of outputting data to be written to a memory cell, the method comprising:
selectively inverting individual bytes of a data word;
setting a plurality of write data inversion flags, each write data inversion flag indicating whether a corresponding byte of the data word is inverted;
outputting the selectively inverted data word; and
outputting the plurality of write data inversion flags at a plurality of pins each of which also carries a data strobe signal during a data read operation for the memory device.

20. The method of claim 19, further comprising outputting a plurality of write data strobes to the memory device, each write data strobe corresponding to one byte of the received data word, wherein writing the selectively inverted data word into the memory cell includes writing each data byte into the memory cell in synchronism with the corresponding write data strobe, and wherein the write data strobes are outputted to the memory device at a plurality of pins each of which also carries a read data inversion flag during a data read operation for the memory device.

21. A method of communicating data between a controller and a memory device, wherein the data comprises a plurality of data words and each data word comprises a plurality of data bytes, the method comprising:
selectively inverting individual bytes of a data word;
setting a plurality of write data inversion flags, each write data inversion flag indicating whether a corresponding byte of the data word is inverted;
outputting the selectively inverted data word;
outputting the plurality of write data inversion flags;
receiving the selectively inverted data word at a data input of the memory device;
receiving the plurality of write data inversion flags at the memory device at a plurality of pins each of which also carries a data strobe signal during a data read operation for the memory device;
selectively inverting individual bytes of the received data word according to the write data inversion flags; and
writing the selectively inverted received data word into a memory cell array of the memory device.

22. The method of claim 21, further comprising receiving a plurality of write data strobes at the memory device, each write data strobe corresponding to one byte of the received data word, wherein writing the selectively inverted data word into the memory cell includes writing each data byte into the memory cell in synchronism with the corresponding write data strobe, and wherein the write data strobes are received at the memory device at a plurality of pins each of which also carries a read data inversion flag during a data read operation for the memory device.

* * * * *